United States Patent
Banerjee

(10) Patent No.: US 12,360,146 B2
(45) Date of Patent: Jul. 15, 2025

(54) METHOD AND APPARATUS TO GENERATE AN ALERT BASED ON HEALTH OF AN EARTHING SYSTEM

(71) Applicant: Sonjib Banerjee, Bengaluru (IN)

(72) Inventor: Sonjib Banerjee, Bengaluru (IN)

(*) Notice: Subject to any disclaimer, the term of this patent is extended or adjusted under 35 U.S.C. 154(b) by 129 days.

(21) Appl. No.: 18/386,611

(22) Filed: Nov. 3, 2023

(65) Prior Publication Data

US 2024/0103057 A1 Mar. 28, 2024

Related U.S. Application Data

(63) Continuation-in-part of application No. 17/419,804, filed on Jun. 30, 2021, now Pat. No. 11,995,970.

(51) Int. Cl.
| | |
|---|---|
| G08B 21/18 | (2006.01) |
| G01N 27/04 | (2006.01) |
| G01R 27/18 | (2006.01) |
| G01R 31/52 | (2020.01) |

(52) U.S. Cl.
CPC ........... *G01R 27/18* (2013.01); *G01N 27/041* (2013.01); *G01R 31/52* (2020.01); *G08B 21/182* (2013.01)

(58) Field of Classification Search
CPC ...... G01R 27/18; G01R 31/52; G01N 27/041; G08B 21/182
See application file for complete search history.

(56) References Cited

U.S. PATENT DOCUMENTS

| | | | | |
|---|---|---|---|---|
| 7,221,282 B1* | 5/2007 | Ross | ..................... | G08B 25/10 340/606 |
| 9,823,289 B2* | 11/2017 | Pal | .......................... | G01R 31/52 |
| 11,995,970 B2* | 5/2024 | Banerjee | ............. | G06F 16/9017 |
| 2016/0349305 A1* | 12/2016 | Pal | .......................... | G01R 31/52 |
| 2018/0340812 A1* | 11/2018 | Den Hartog | ........ | G01F 23/0007 |
| 2022/0092961 A1* | 3/2022 | Banerjee | ................ | G01N 33/24 |
| 2024/0103057 A1* | 3/2024 | Banerjee | ................ | G01R 31/52 |
| 2025/0060501 A1* | 2/2025 | Patel | ........................ | G01V 3/02 |

* cited by examiner

*Primary Examiner* — Hoi C Lau
(74) *Attorney, Agent, or Firm* — Jose Cherson Weissbrot

(57) ABSTRACT

An apparatus (100) to generate an alert based on a health of an earthing system is provided. The apparatus includes a single electrode arrangement comprising a single electrode (102) having one or more sensors (106a-106b) mounted thereon and configured to measure (402) a resistance of an earth pit existing within the earthing system during normal and fault time. The apparatus (100) further includes an electronic module (104) that is communicatively coupled between the one or more sensors (106a-106b) and a communication system (116), and that is configured to communicate (406) the resistance of the earth pit as recorded by the one or more sensors (106a-106b) to the communication system (116); and generate (406) an alert when the resistance of the earth pit exceeds a threshold value. The single electrode (102) is connected via one or more communication means to the electronic module (104).

19 Claims, 4 Drawing Sheets

METHOD AND APPARATUS TO GENERATE AN ALERT BASED ON HEALTH OF AN EARTHING SYSTEM

RELATED APPLICATION

The present application claims priority under 35 U.S.C. § 119 to Indian patent application number 202141056798 (now granted as Patent No. 381603) filed 9 Jan. 2019 the entire contents of which are hereby incorporated herein by reference. The instant application is related to granted Indian Patent No: 381603, and co-pending PCT Application No. PCT/IN2019/050691, titled, "A METHOD AND APPARATUS FOR REMOTE FAULT-TIME EARTH RESISTANCE MONITORING", with inventor Sonjib Banerjee, and filed on 20 Sep. 2019.

The present application is also a continuation-in-part (CIP) application of U.S. patent application Ser. No. 17/419,804 ("the '804 application"), which was filed 20 Sep. 2019. All of the aforementioned applications are hereby incorporated by reference in their entireties into the present application.

FIELD

The present invention relates to detecting earth faults or discharge in earth pits, and more particularly the present invention relates to a method and apparatus for remote fault-time earth resistance monitoring and generating an alert, based on a health of an earthing system.

BACKGROUND

Monitoring the health of an earthing system is a preliminary for various electrical, instrumentation and communication systems. In order to avoid accidents or interruptions in power and communication, earth faults need to be quickly detected and avoided by constantly measuring the earthing values, and alerting an operator personnel regarding possible outages. High earth values can burn or damage any electrical, instrumentation and communication equipment. Ultimately, industrial establishments, face a huge loss for maintenance and replacement of components that get damaged during earth faults or discharges.

Currently, there are many devices or apparatuses in the market that monitor earth values. The earth values are dependent on a soil resistivity or earth resistivity that depends on type and quality of soil and changes from place to place. Generally, earth pit or earth grids are passive systems whose efficiency depends on continuously varying resistivity of the soil in immediate vicinity of earth conductor. The method of measuring earth pit resistance is a manual process, as mentioned in IEEE 81 2013, BSEN 7430 and other relevant standards, is considered to be more conventional and has its drawback.

The traditional task delegation of operating and measuring the earth pit resistance in a manual process, is often plagued because of the time constraints by the manual process and the task quality is perceived differently by different supervisors. This causes inconsistency in efficiency of manual measurement and often the very best resource gets grossly unrecognized, leading to unsatisfied measurement and monitoring of earth pit resistance. Hence, there is a need for a device that can automatically sense and monitor the earth pit resistance.

The earth resistance is measured during a healthy condition as manual measurement unsafe and dangerous at the time of fault/discharge. Moreover, time of electrical fault, lightning or any other type of electrical discharge cannot be predicted. Hence, it becomes mandatory to automate detection a fault/discharge and measurement of earthing efficacy at the time of fault.

Further, it is beneficial to have devices that monitor the resistance of the earth pits or of an earth grid associated with an industrial establishment irrespective of the location of the earth pits or the earth grid, and that are capable of responding to dynamic changes in the soil resistance. Prior art techniques disclosed in patent application no. US 20160349305A1 titled "Automated digital earth fault system" discloses an automated earth fault testing system that monitors the earthing system and provides an early failure indication of the earthing resistance irrespective of the location. However, the prior art reference teaches a multi-point measurement method where a plurality of electrodes is used at a reference point and at an earth pit where resistance measurement is required. Such multi-point measurement results in inaccuracies when the earth pit whose resistance is to be measured is part of an earth grid. This is due to the fact that, potential difference between the reference pit and the earth pit is measured by current flowing along a path of the earth grid between the reference pit and the earth pit. As the current movement is non-linear due to presence of the earth grid, and presence of various nodes of the grid, the measurement of potential between any two potential probe of multipoint measurement method within an earth grid is not accurate. Over and above the prior art reference cannot detect an earth fault or discharge and measure the earth pit resistance at the time of fault.

Hence, there is a need for an improved method and apparatus that can measure an absolute value of earth pit resistance and accordingly raise an alert based on the earth pit resistance, as value of the earth pit resistance is indicative of the health of the earthing system. The alternate method must involve a single electrode measurement method instead of a multi electrode or multi-point measurement method, in order to avoid the inaccuracies generated due to current path movements between multiple electrodes. Accordingly, an improved method and apparatus for generating an alert based on a health of the earthing system is disclosed.

Hence, there is a need for an improved method and apparatus that can detect electrical fault, lightning or any other type of electrical discharge into the earth pit. The resistance of the earth pit changes due to ionization of soil during the discharge.

Hence, there is a need for an improved method and apparatus that can measure absolute value of earth pit resistance and accordingly raise an alert based on the earth pit resistance, as value of the earth pit resistance is indicative of the health of the earthing system.

SUMMARY

The following summary is illustrative only and is not intended to be in any way limiting. In addition to the illustrative aspects, example embodiments, and features described, further aspects, example embodiments, and features will become apparent by reference to the drawings and the following detailed description.

Briefly, according to an example embodiment, an apparatus to generate an alert based on a health of an earthing system is provided. The apparatus comprises a single electrode arrangement comprising a single electrode comprising a hollow conductive rod having one or more sensors mounted thereon and buried in an earth pit. The single electrode is configured to detect an earth fault or a discharge and measure a resistance of the earth pit existing within the earthing system in normal and fault time conditions. Typically, the earth pit provides a discharge path for a communication system that is supported by the earthing system. In an embodiment, the earth pit is connected to a grid of the earthing system. In another embodiment, the earth pit is one of the plurality of assorted earth pits located outside and disconnected from the grid of the earthing system. The apparatus further includes an electronic module communicatively coupled between the single electrode and a communication system. The electronic module is configured to communicate the resistance of the earth pit as recorded by the single electrode to the communication system, and generate an alert when the resistance of the earth pit exceeds a threshold value. The single electrode is connected via one or more communication means to the electronic module.

In an embodiment, the one or more communication means, include a first set of cables hardwired to the one or more sensors at one end and hardwired to a first connector at another end; a second set of cables hardwired to the at least one pair of terminals at one end and the first connector at another end; and a second connector coupled to the first connector within the connector module at one end and to the electronic module at another end. The trigger is communicated from the electronic module via the connector module to the second set of cables, and the resistance of the earth pit is communicated from the first set of cables via the connector module to the electronic module. The connector module includes a connection between a male connector and a female connector, where the male connector is the first connector and the female connector is the second connector.

The single electrode arrangement further includes a fault alert circuit (FAC) comprising at least one pair of terminals provided around a circumference of the single electrode, and configured to detect an occurrence of the earth fault or the discharge when a potential difference between the at least one pair of terminals exceeds a predefined voltage level, and trigger the one or more sensors to record the resistance of the earth pit when the occurrence of the earth fault or the discharge is detected, and communicate the occurrence of the earth fault or the discharge to the electronic module. In order to communicate the occurrence of the earth fault or discharge to the electronic module, the at least one pair of terminals of the FAC are communicatively coupled to the electronic module.

Generally, the FAC triggers the one or more sensors, which are part of a resistance measurement circuit, to record the resistance of the earth pit at a time of fault, where the fault is an electrical fault, lightning or any other type of electrical discharge within the earth pit. The electronic module then communicates the resistance of the earth pit as measured at the time of fault and received from the single electrode to the communication system.

In an embodiment, the earth fault is said to occur when the resistance of the earth pit exceeds the threshold value, thereby indicating a deteriorated health of the earthing system. A deteriorated health of the earthing system can lead to technical failures like short circuits in the electrical system, and circuitry of the communication system. Generally, the value of the resistance of the earth pit is communicated at different times and hence a plurality of values of the resistance of the earth pit including the value of the resistance during normal conditions and the value of the resistance at the time of fault are stored in a database of the communication system.

In another embodiment, the electronic module is further configured to receive a failure alert from the communication system, when a failure occurs within the communication system. Upon receiving the failure alert, the electronic module triggers the one or more sensors to measure the resistance of the earth pit; and communicates the resistance as measured of the earth pit to the communication system, wherein the resistance of the earth pit at a time of occurrence of the failure is a fault resistance associated with the earth fault or the discharge within the earth pit.

In an embodiment, the electronic module communicates an earth pit identifier along with the resistance of the earth pit to the communication system. The earth pit identifier indicates a location of the earth pit. The communication system includes a cloud-based compiler configured to convert the resistance of the earth pit to the soil resistivity value, and a database configured to store the resistivity value along with the earth pit identifier. Further, the value of the resistance of the earth pit, the soil resistivity value of the earth pit at various time intervals and as received from the electronic module are stored in the database, along with the threshold value of the resistance, the other threshold value of the soil resistivity value, and the earth pit identifier are also stored in the database of the communication system.

In case the resistivity value exceeds another threshold value as stored in the database against the earth pit identifier, a processor of the communication system creates another alert indicating that the resistance of the earth pit indicates an earth fault. The alert includes one or more of video alerts, an audio alert, a mail alert or a text message-based alert.

In another embodiment, a method for generating an alert based on a health of an earthing system is disclosed. The method includes, measuring by a single electrode buried in an earth pit, a resistance of the earth pit associated with the earthing system. The method further includes, recording the resistance in an electronic module that is communicatively coupled to the single electrode, and generating the alert by the electronic module, when the resistance exceeds a threshold value. Typically, the resistance of the earth pit as measured indicated a health of the earthing system. If the resistance exceeds the threshold value it indicates occurrence of an earth fault. The resistance and the alert are communicated to a communication system.

Further, the method includes receiving by the electronic module, a trigger from the communication system to record the resistance of the earth pit, when a fault or discharge is detected within the communication system, and directing a fault alert circuit (FAC) coupled to the single electrode to record the earth pit resistance upon receiving the trigger signal. The system further includes communicating the resistance of the earth pit along with an earth pit identifier to the communication system, and receiving another alert from the communication system, when a soil resistivity value exceeds another threshold value, where the resistance of the earth pit is converted by the communication system to a soil resistivity value. Further, the method includes transmitting the alert to one or more of a regulatory body, a disaster management cell, a fire department via one or more communication networks, where the alert comprises, information associated with a location of the earth pit.

BRIEF DESCRIPTION OF THE FIGURES

These and other features, aspects, and advantages of the example embodiments will become better understood when the following detailed description is read with reference to the accompanying drawings in which like characters represent like parts throughout the drawings, wherein.

DETAILED DESCRIPTION OF EXAMPLE EMBODIMENTS

Figure 1:
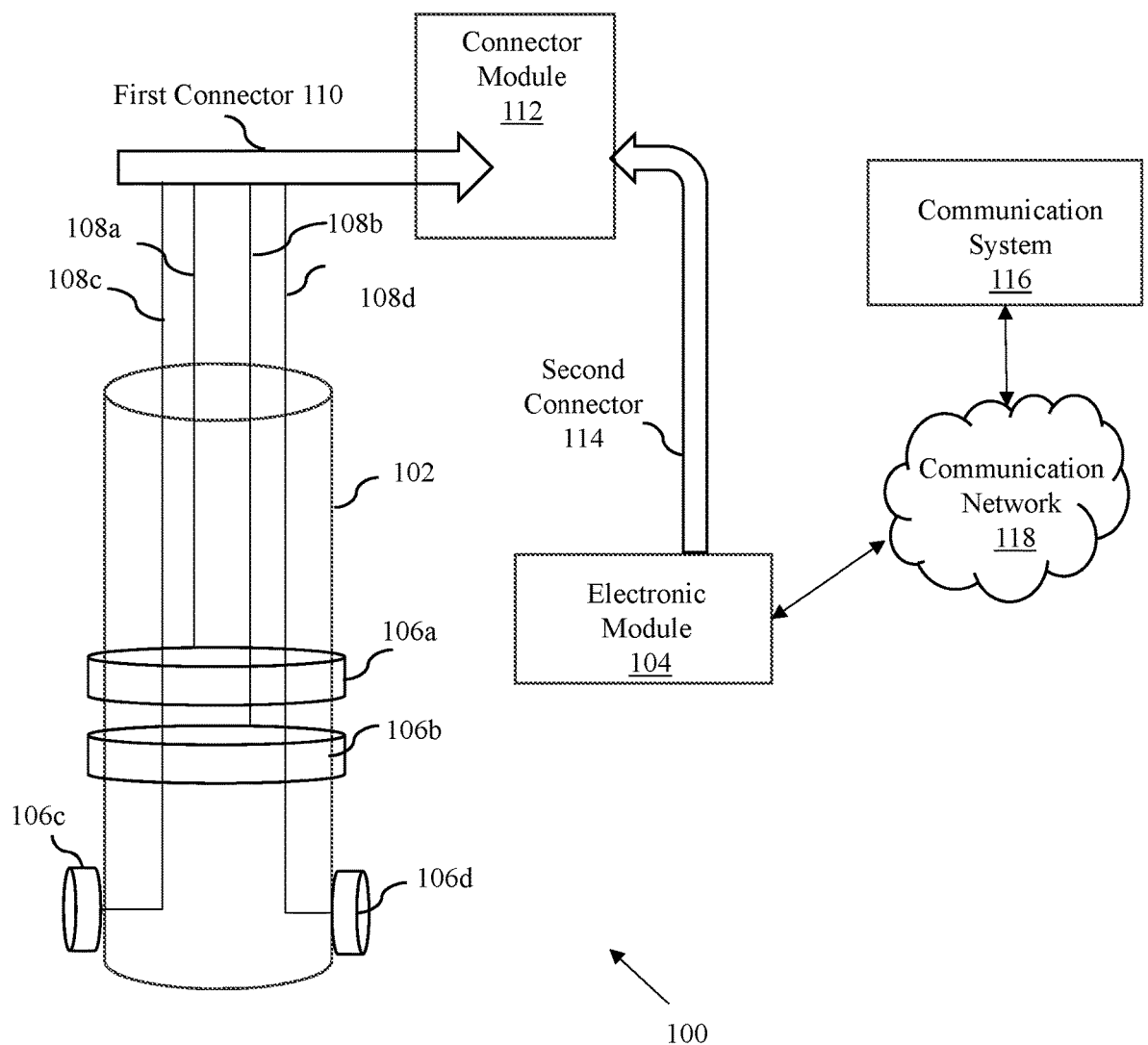
FIG. 1 is a block diagram of an apparatus to generate an alert based on a health of an earthing system, according to an example embodiment.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in many alternate forms and should not be construed as limited to only the example embodiments set forth herein.

Accordingly, while example embodiments are capable of various modifications and alternative forms, example embodiments are shown by way of example in the drawings and will herein be described in detail. It should be understood, however, that there is no intent to limit example embodiments to the particular forms disclosed. On the contrary, example embodiments are to cover all modifications, equivalents, and alternatives thereof. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed but may also have additional steps not included in the figure. The processes may correspond to methods, functions, procedures, subroutines, subprograms, etc.

Specific structural and functional details disclosed herein are merely representative for purposes of describing example embodiments. Inventive concepts may, however, be embodied in many alternate forms and should not be construed as limited to only the example embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Further, although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the scope of inventive concepts.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular example embodiments only and is not intended to be limiting. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in 'addition to the orientation depicted in the figures. For example, if the device in the figures is turned over, elements described as "below", or "beneath" other elements or features would then be oriented "above" the other elements or features. Thus, term such as "below" may encompass both an orientation of above and below. The device may be otherwise oriented (rotated 90 degrees or at other orientations) and the spatially relative descriptors used herein are interpreted accordingly.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

At least one example embodiment is generally directed to techniques for evaluation of loyalty programs employed by organizations. In particular, the embodiments disclose techniques relating to generation of an alert based on a health of an earthing system. An earthing system includes one or more earth pits present inside an earth grid or one or more assorted earth pits present outside the earth grid.

Turning to the drawings, FIG. 1 is a block diagram illustrating one embodiment of an apparatus 100 that may be employed within the earthing system. In some embodiments, the apparatus 100 may be coupled to a communication system 116 via a communication network 118 (GSM, Wi-Fi, or other wireless technologies). The apparatus 100 includes a single electrode arrangement including a single electrode 102, one or more sensors 106a-106b, at least one pair of terminals 106c-106d of a Fault Alert Circuit (FAC), a connector module 112, and an electronic module 104. The connector module 112 includes a coupling between a first connector 110 and a second connector 114. In an embodiment, the first connector 110 can be a male connector that physically interlocks with the second connector 114 which can be a female connector.

Typically, the single electrode 102 is a hollow conductive pipe buried in an earth pit. The one or more sensors 106a-106b are mounted on the single electrode 102. One side of the single electrode 102 is sealed and buried in the earth pit associated with the earthing system. Another side of the single electrode 102, is kept open and through which a first set of cables 108c-108d, and a second set of cables 108a-108b pass through. The first set of cables 108c-108d connect the at least one pair of terminals 106c-106d to the first connector 110 of the connector module 112. The second set of cables 108a-108b connect the one of more sensors 106a-106b to the first connector 110 of the connector module 112. In an embodiment, the first connector 110 and the second connector 114 can include a plurality of parallel electrical connections.

In an example, the first set of cables 108c-108d (e.g., EM compatible cable wires) are hardwired to the one or more sensors 106a-106b at one end and to a first connector 110 of the connector module 112 at another end. Further, a second connector 114 is coupled to the first connector 110 within the connector module 112, at one end and to the electronic module 104 at another end. In an example, the first connector 110 is a male connector and the second connector 114 is a female connector. The resistance of the earth pit is communicated from the first set of cables 108c-108d via the connector module 112 to the electronic module 104. Further, the second set of cables 108a-108b are hardwired to the at least one pair of terminals 106c-106d at one end and the first connector 110 at another end.

The first connector 110 is coupled to the second connector 114 within the connector module 112. The second connector 114 is in turn connected to the electronic module 104. The one or more sensors 106a-106b are configured to measure the resistance of the earth pit, when a trigger is received from the at least one pair of terminals 106c-106d of the FAC. In operation, the electronic module 104 sends the trigger to the one or more sensors 106a-106b when a potential measured between the at least one pair of terminals 106c-106d of the FAC exceeds a predefined voltage level.

Typically, a potential difference is measured between the at least one pair of terminals 106c-106d, and the potential difference is communicated via a first communication means to the electronic module 104. The first communication means includes the first set of cables 108c-108d, the first connector 110, and the second connector 114. Upon receiving the potential difference, the electronic module 104, compared the potential difference with a predefined voltage. Incase the potential difference exceeds the predefined voltage, the electronic module 104 is configured to identify such condition as an occurrence of the earth fault or the discharge. Further, the electronic module 104 triggers the one or more sensors 106a-106b via a second communication means to record the resistance of the earth pit upon identifying occurrence of the earth fault or the discharge. The second communication means, includes the second connector 114, the first connector 110, and the second set of cables 108a-108b. The first communication means and the second communication means comprise the one or more communication means that connect the electronic module 104 to the at least one pair of terminals 106c-106d and the one or more sensors 106a-106b.

In an embodiment, the first set of cables 108c-108d, is hardwired to the at least one pair of terminals 106c-106d at one end and the first connector 110 at another end. Similarly, the second set of cables 108a-108b is hardwired to the one or more sensors 106a-106b at one end and to the first connector 110 at another end.

The measurement of the resistance is done using the one or more sensors 106a-106b mounted on the single electrode 102, thereby eliminating the need for an additional potential electrode also knows as a reference electrode, for measuring the resistance of the earth pit. By practicing the method disclosed, the potential drop or resistance encountered between the single electrode and the reference electrode while measuring resistance of the earth pit in a multi-electrode system is avoided. Hence, the resistance of the earth pit measured by the disclosed method is more accurate than the resistance measured using multi-electrode systems.

The electronic module 104, is communicatively coupled to the communication system 116. The electronic module 104, can include a processor, and at least one memory, and the processor is configured to communicate the resistance of the earth pit as recorded by the single electrode 102 to the communication system 116 via the communication network 118. The electronic module 104, is also configured to generate an alert when the resistance of the earth pit exceeds a threshold value. In an embodiment, the alert can be transmitted by the electronic module 104 to an application 304, hosted on a mobile device 302. The mobile device 302 can be associated with a regulatory body, a disaster management cell, or a fire department via one or more communication networks. Typically, the alert comprises information associated with a location of the earth pit. The alert can be in the form of a video alert showing the earth pit and the location. In another example, the alert can be an audio alert, a mail alert or a text message-based alert.

Typically, the earth pit is associated with an identifier that comprises information related to a location of the earth pit and a number assigned to the earth pit to help identify the earth pit. The identifier is stored in a database of the communication system as a record to identify the earth pit and the location. In an embodiment, along with the alert, the electronic module 104 can also be configured to read the identifier of the earth pit, and communicate the identifier along with the alert to the communication system. In this manner, the location of the earth pit and thereby location of the fault is obtained by the communication system. This can be used by the operator to send a maintenance team at the time of occurrence of the fault to rectify the fault occurring at the earth pit. In an embodiment, the identifier of the earth pit can be configured within a RFID tag that is positioned at the earth pit, and a RFID reader can be configured within the electronic module 104 to read the RFID tag and fetch the identifier of the earth pit.

Further, the threshold value of the resistance of the earth pit is pre-stored against the identifier of the earth pit in the at least one memory of the electronic module 104, and in the database 206 of the communication system 116. Likewise, the threshold value of resistance of each earth pit of the earthing system is stored in the electronic module 104 and in the database 206. When the resistance of the earth pit exceeds the threshold value, it indicates occurrence of the earth fault or the discharge in the earth pit, which necessitates sending an alert to the communication system 116. The electronic module 104, generates the alert and communicates the alert, the identifier of the earth pit, along with the resistance of the earth pit to the communication system 116.

At the communication system 116, the resistance is converted into soil resistivity value by a cloud-based compiler 204 (see FIG. 2), and the soil resistivity value is compared with another threshold value. In case the soil resistivity value exceeds the other threshold value; it indicates occurrence of an earth fault at the earth pit. In another embodiment, incase the alert is not generated by the electronic module 104, the alert is generated by the communication system 116, when the soil resistivity value exceeds the other threshold value. The alert is communicated by the communication system to the electronic module 104. The other alert can also be communicated to the regulatory bodies or the operator, so that the earth fault can be attended to. A database 206 (see FIG. 2) is configured to store the soil resistivity value along with the identifier.

The aforementioned embodiments, disclose detecting an earth fault or discharge at the earth pit and generating an alert to the communication system from the earth pit. In an alternate embodiment, the earth fault or discharge can occur at the earth pit, and the resistance of the earth pit needs to be recorded at a time of occurrence of the earth fault or discharge for future record purpose. To facilitate such recording of the resistance, a fault alert circuit is provided at the apparatus 100 as disclosed hereinbelow.

The at least one pair of terminals 106*c*-106*d*, of the FAC are provided around a circumference of the single electrode 102, and are configured to trigger one or more sensors 106*a*-106*b* to record the resistance of the earth pit at a time of fault or when the earth fault occurs at the earth pit. The earth fault can occur due to lightning or any other type of natural discharge, or the earth fault can occur due to normal course of usage of the earth pit over a long period of time. For example, when an earth pit is being used for over 3-5 years, the grounding capacity can get reduced due to naturally deteriorating factors, and thereby the resistance of the earth pit can increase, which prevents the earth pit from serving as a good grounding terminal for electrical networks like the communication system 116.

Alternatively, when a failure occurs at the communication 116, a failure alert is communicated to the electronic module 104 from the communication system 116 via the communication network 114. It is understood that the failure could have occurred due to the earth fault or discharge occurring at the earth pit. Hence, in such an instance, the electronic module 104, can upon receiving the failure alert, send a trigger signal to the one or more sensors 106*a*-106*b*, to record the resistance of the earth pit. This resistance of the earth pit is referred to as the fault resistance of the earth pit, and is communicated from the one or more sensors 106*a*-106*b* to the electronic module 104, and from the electronic module 104 to the communication system 116.

In another embodiment, an earthing system comprising one or more earth pits that provide a discharge path for a communication system is disclosed. The one or more earth pits is positioned inside an earth grid or is located outside and disconnected from the earth grid. Further, the earthing system includes one or more apparatuses, wherein an apparatus is similar to the apparatus 100 disclosed in FIG. 1. Each of the apparatus is coupled to an earth pit to generate an alert based on a health of the earth pit. The apparatus can include a single electrode arrangement comprising a single electrode buried in the earth pit and configured to measure a resistance of the earth pit by one or more sensors at predefined time intervals; wherein the one or more sensors are mounted on the single electrode. The apparatus can further include an electronic module communicatively coupled between the single electrode and the communication system, and configured to receive the value of the resistance of the earth pit from the one or more sensors via one or more communication means; compare the value of the resistance with a threshold value; communicate the value of the resistance of the earth pit to the communication system; and generate an alert when the value of the resistance of the earth pit exceeds the threshold value, wherein the alert indicates occurrence of an earth fault or a discharge within the earth pit. The single electrode is connected via the one or more communication means to the electronic module.

Further, the electronic module is configured to communicate to the communication system a normal health condition of the earthing system in regular time intervals when the value of the resistance of the earth pit as measured by the one or more sensors is below the threshold value. The electronic module is also configured to communicate to the communication system a deteriorated health condition of the earthing system along with the alert, when the value of the resistance of the earth pit as measured by the one or more sensors exceeds the threshold value.

Figure 2:
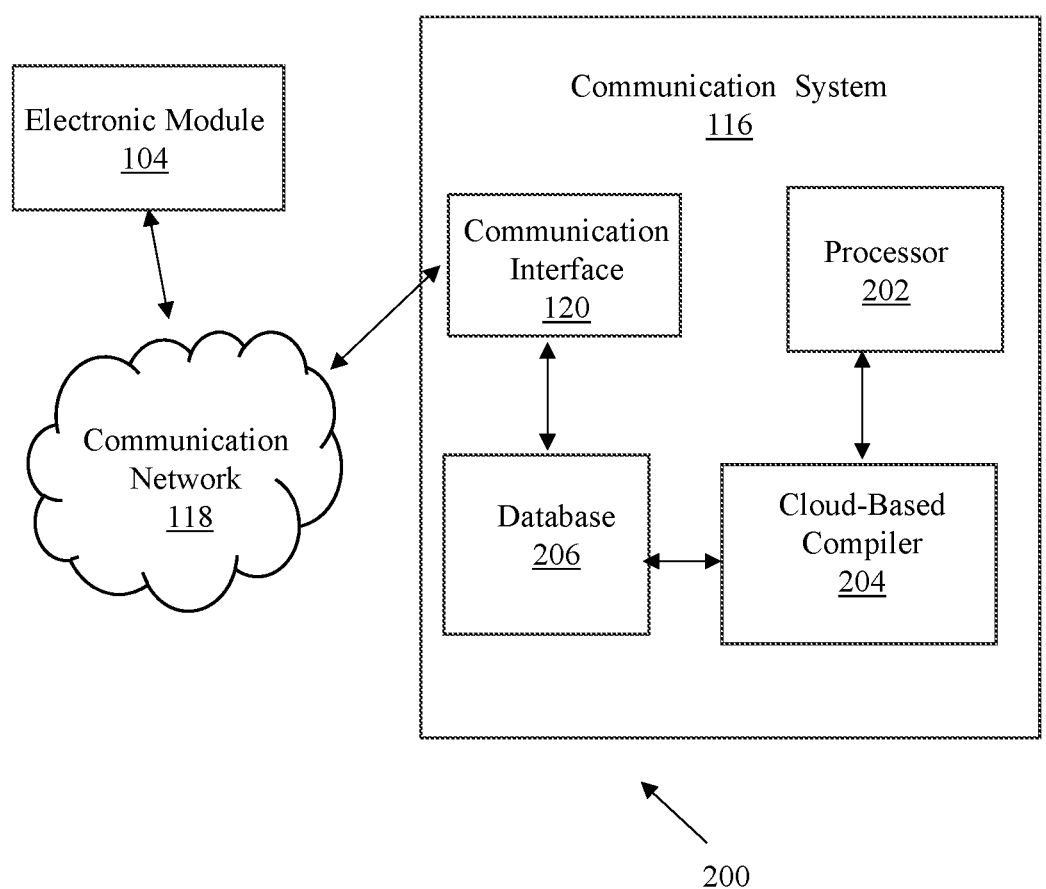
FIG. 2 is an example illustration of an environment illustrating communication of the alert by the apparatus of FIG. 1, to a communication system.

FIG. 2 depicts an environment 200 illustrating communication of the alert by the apparatus of 100 to the communication system 116. The communication system 116 includes a processor 202, a cloud-based compiler 204, a database 206, and a communication interface 120. When a resistance of the earth pit is received by the cloud-based compiler 204 of the communication system 116 from the apparatus 100 via the communication network 118, it is converted in a soil resistivity value. The soil resistivity value is then compared against another threshold value for soil resistivity as stored in the database 206 of the earth pit. In case the soil resistivity value exceeds the threshold, another alert is generated by the processor 202. The other alert is communicated to the apparatus 100.

Figure 3:
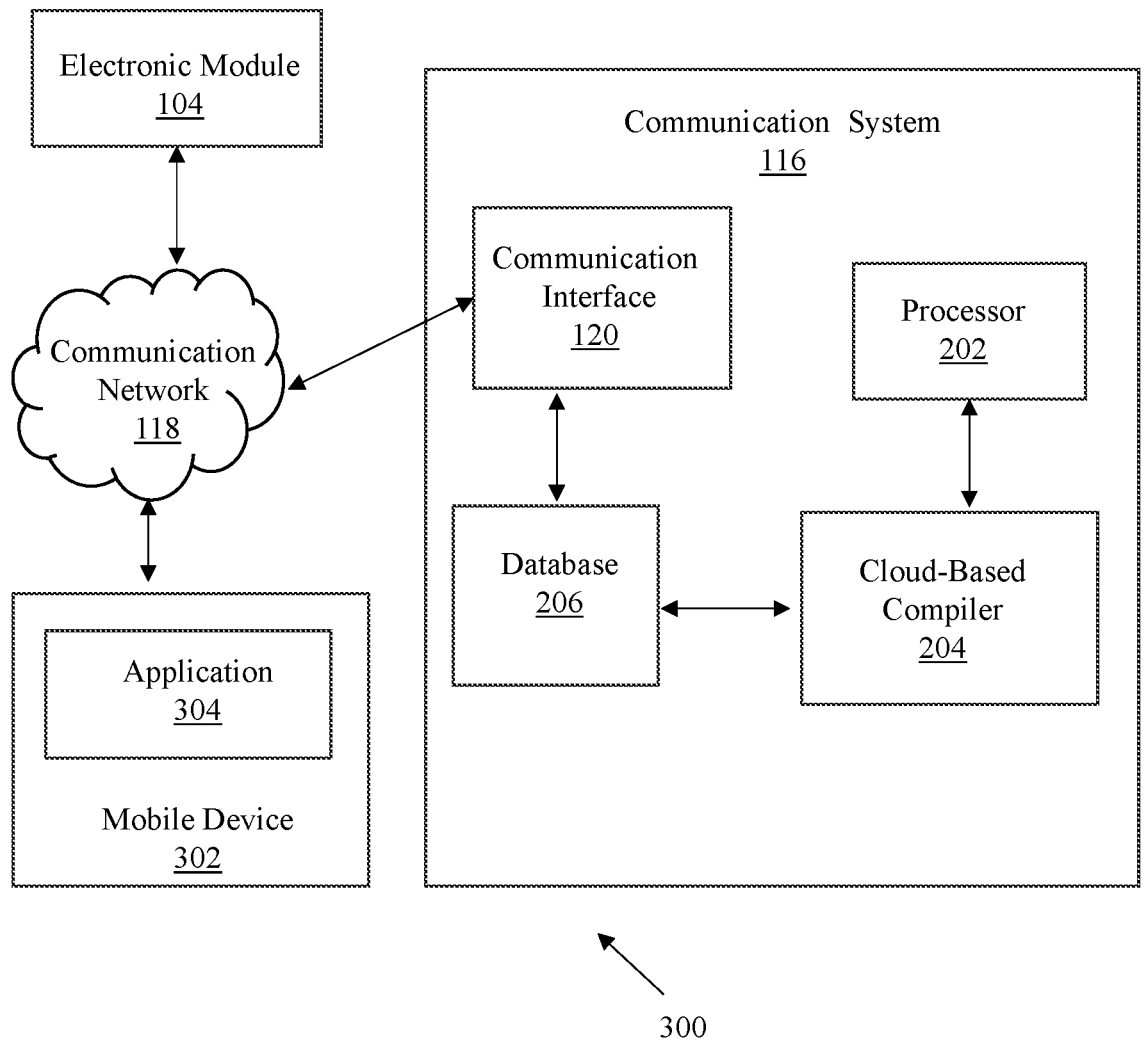
FIG. 3 is an example illustration of an environment illustrating communication of the alert by the apparatus of FIG. 1, to a mobile device.

FIG. 3 illustrates an environment 300 in which the apparatus 100, the communication system 116 and a mobile device 302 are connected over a communication network. and the mobile device 302 over the communication network 118. In an example, the mobile device 302 has an application 304, configured to route the other alert received from the communication system 116 and the alert received from the apparatus 100 to desired authorities and personnel in charge of management of the communication system 116 and the earthing system. For example, the desired authorities can be a fire department.

Figure 4:
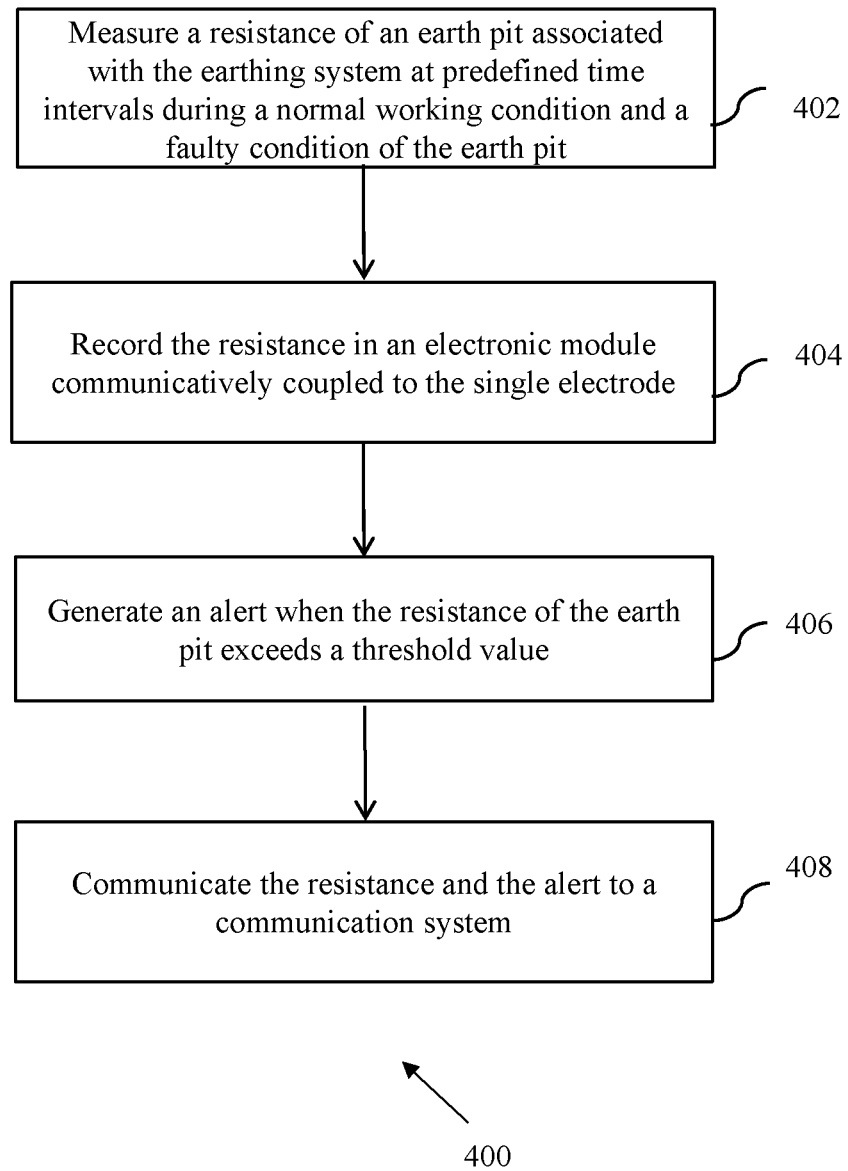
FIG. 4 is a block diagram of flowchart illustrating method for generating an alert based on a health of an earthing system.

A method of generating an alert based on a health of an earthing system is explained further with respect to FIG. 4.

At 402, a resistance of an earth pit associated with an earthing system is measured by a single electrode buried in the earth pit. The earth pit is connected inside an earth grid of the earthing system, or is an assorted earth pit located outside the earth grid. The earthing system is associated with the operations of the communication system.

At 404, the measured resistance is recorded by an electronic module that is communicatively coupled to the single electrode.

At 406, an alert is generated by the electronic module, when the resistance of the earth pit exceeds a threshold value, where the resistance is indicative of the health of the earthing system. The alert is transmitted to one or more of a regulatory body, a disaster management cell, a fire department via one or more communication networks. In an embodiment, the alert includes information associated with a location of the earth pit.

At 408, the resistance and the alert are communicated by the electronic module to a communication system. The earth pit identifier is communicated along with the resistance of the earth pit to the communication system. In an embodiment, at the communication system the resistance is converted into a soil resistivity value. The communication system generates another alert and communicates the other alert to the electronic module, when the soil resistivity value exceeds another threshold value.

It will be understood by those within the art that, in general, terms used herein, are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present.

For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

While only certain features of several embodiments have been illustrated, and described herein, many modifications and changes will occur to those skilled in the art. It is, therefore, to be understood that the appended claims are intended to cover all such modifications and changes as fall within the true spirit of inventive concepts.

The aforementioned description is merely illustrative in nature and is in no way intended to limit the disclosure, its application, or uses. The broad teachings of the disclosure may be implemented in a variety of forms. Therefore, while this disclosure includes particular examples, the true scope of the disclosure should not be so limited since other modifications will become apparent upon a study of the drawings, the specification. It should be understood that one or more steps within a method may be executed in different order (or concurrently) without altering the principles of the present disclosure. Further, although each of the example embodiments is described above as having certain features, any one or more of those features described with respect to any example embodiment of the disclosure may be implemented in and/or combined with features of any of the other embodiments, even if that combination is not explicitly described. In other words, the described example embodiments are not mutually exclusive, and permutations of one or more example embodiments with one another remain within the scope of this disclosure.

The example embodiment or each example embodiment should not be understood as a limiting/restrictive of inventive concepts. Rather, numerous variations and modifications are possible in the context of the present disclosure, in particular those variants and combinations which may be inferred by the person skilled in the art with regard to achieving the object for example by combination or modification of individual features or elements or method steps that are described in connection with the general or specific part of the description and/or the drawings, and, by way of combinable features, lead to a new subject matter or to new method steps or sequences of method steps, including insofar as they concern production, testing and operating methods. Further, elements and/or features of different example embodiments may be combined with each other and/or substituted for each other within the scope of this disclosure.

Still further, any one of the above-described and other features of example embodiments may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Further, at least one example embodiment relates to a non-transitory computer-readable storage medium comprising electronically readable control information (e.g., computer-readable instructions) stored thereon, configured such that when the storage medium is used in a controller of a magnetic resonance device, at least one example embodiment of the method is carried out.

Even further, any of the aforementioned methods may be embodied in the form of a program. The program may be stored on a non-transitory computer readable medium, such that when run on a computer device (e.g., a processor), cause the computer-device to perform any one of the aforementioned methods. Thus, the non-transitory, tangible computer readable medium is adapted to store information and is adapted to interact with a data processing facility or computer device to execute the program of any of the above-mentioned embodiments and/or to perform the method of any of the above-mentioned embodiments.

The computer readable medium or storage medium may be a built-in medium installed inside a computer device main body or a removable medium arranged so that it may be separated from the computer device main body. The term computer-readable medium, as used herein, does not encompass transitory electrical or electromagnetic signals propagating through a medium (such as on a carrier wave), the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices), volatile memory devices (including, for example static random access memory devices or a dynamic random access memory devices), magnetic storage media (including, for example an analog or digital magnetic tape or a hard disk drive), and optical storage media (including, for example a CD, a DVD, or a Blu-ray Disc). Examples of the media with a built-in rewriteable non-volatile memory, include but are not limited to memory cards, and media with a built-in ROM, including but not limited to ROM cassettes, etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave), the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices), volatile memory devices (including, for example static random access memory devices or a dynamic random access memory devices), magnetic storage media (including, for example an analog or digital magnetic tape or a hard disk drive), and optical storage media (including, for example a CD, a DVD, or a Blu-ray Disc). Examples of the media with a built-in rewriteable non-volatile memory, include but are not limited to memory cards, and media with a built-in ROM, including but not limited to ROM cassettes, etc. Furthermore, various information regarding stored images, for example, property information, may be stored in any other form, or it may be provided in other ways.

The apparatuses and methods described in this application may be partially or fully implemented by a special purpose computer created by configuring a general-purpose computer to execute one or more particular functions embodied in computer programs. The functional blocks and flowchart elements described above serve as software specifications, which may be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The invention claimed is:

1. An apparatus (100) to generate an alert based on a health of an earthing system, the apparatus comprising:
   a single electrode arrangement comprising:
      a single electrode (102) having one or more sensors (106a-106b) mounted thereon and configured to measure a resistance of an earth pit associated with the earthing system at predefined time intervals; and
   an electronic module (104) communicatively coupled between the single electrode and a communication system (116), and configured to:
      receive the value of the resistance of the earth pit from the one or more sensors (106a-106b);

compare the value of the resistance with a threshold value;
communicate the value of the resistance of the earth pit to the communication system (116); and
generate the alert when the value of the resistance of the earth pit exceeds the threshold value, wherein the alert indicates occurrence of an earth fault or a discharge within the earth pit;
and wherein the single electrode (102) is connected via one or more communication means to the electronic module (104);
and wherein the earth pit provides a discharge path for the communication system (114).

2. The apparatus of claim 1, wherein the electronic module is further configured to:
communicate to the communication system (116) a normal health condition of the earthing system during time intervals when the value of the resistance of the earth pit as measured by the one or more sensors (106a-106b) is below the threshold value; and
communicate to the communication system a deteriorated health condition of the earthing system along with the alert, when the value of the resistance of the earth pit as measured by the one or more sensors (106a-106b) exceeds the threshold value.

3. The apparatus of claim 1, wherein the single electrode arrangement further comprises:
a fault alert circuit (FAC) comprising at least one pair of terminals (106c-106d) provided around a circumference of the single electrode (102) and communicatively coupled to the electronic module (104); and wherein the FAC is configured to:
measure a potential difference between the at least one pair of terminals (106c-106d) and communicate the potential difference via a first communication means to the electronic module (104); and
wherein the electronic module (104) identifies occurrence of the earth fault or the discharge when the potential difference exceeds a predefined voltage; and
wherein the electronic module (104) triggers the one or more sensors (106a-106b) via a second communication means to record the resistance of the earth pit upon identifying occurrence of the earth fault of the discharge; and
wherein the one or more communication means comprises the first communication means and the second communication means.

4. The apparatus of claim 3, wherein the single electrode arrangement further comprises:
a plurality of cables comprising a first set of cables (108c-108d) and a second set of cables (108a-108b);
a connector module (112) comprising a coupling between a first connector (110) and a second connector (114), wherein
the first set of cables (108c-108d) is connected to the at least one pair of terminals (106c-106d) at one end and is connected to the first connector (110) at another end; and wherein
the second set of cables (108a-108b) is connected to the one or more sensors (106a-106b) at one end and is connected to the first connector (110) at another end; and wherein
the second connector (114) is coupled to the first connector (110) within the connector module (112) at one end and to the electronic module (104) at another end, and wherein the first communication means connects the at least one pair of terminals (106c-106d) to the electronic box (104) and comprises the first set of cables (108c-108d), the first connector (110) and the second connector (114); and wherein
the second communication means connects the one or more sensors (106a-106b) to the electronic box (104) and comprises the second set of cables (108a-108b), the first connector (110) and the second connector (114).

5. The apparatus of claim 1, wherein the electronic module (104) is further configured to:
receive a failure alert from the communication system (116), when a failure occurs within the communication system (116);
trigger the one or more sensors (106a-106b) to measure the value of the resistance of the earth pit upon receiving the failure alert; and
communicate the value of the resistance of the earth pit to the communication system (116), wherein the resistance of the earth pit is a fault resistance associated with the earth fault or the discharge within the earth pit that caused the failure.

6. The apparatus of claim 1, wherein the electronic module (104) is further configured to:
communicate an identifier of the earth pit along with the value of the resistance of the earth pit to the communication system (116); wherein the identifier comprises information related to a location of the earth pit; and
receive an alert from the communication system (116) when a soil resistivity value equivalent of the value of the value of the resistance exceeds another threshold value, wherein the value of the resistance is converted to the soil resistivity value within the communication system (116).

7. The apparatus as claimed in claim 6, wherein the communication system (116) comprises:
a cloud-based compiler (204) configured to convert the value of the resistance of the earth pit to the soil resistivity value, and compare the soil resistivity value against the threshold value; and
a database (206) configured to store the soil resistivity value, the value of the resistance of the earth pit, along with the identifier of the earth pit in a row of the database (206).

8. The apparatus of claim 6, wherein the electronic module (104) is, communicatively coupled to a mobile device (302), and is further configured to:
transmit the alert to the mobile device (302) via the communication network (118), wherein the mobile device is associated with one or more of a regulatory body, a disaster management cell, a fire department, and wherein the alert comprises information associated with the earth fault or the discharge and the information related to the location of the earth pit.

9. An earthing system comprising:
one or more earth pits that provide a discharge path for a communication system (116); wherein the one or more earth pits is positioned inside an earth grid or is located outside and disconnected from the earth grid;
one or more apparatuses, wherein an apparatus (100) is coupled to an earth pit to generate an alert based on a health of the earth pit, the apparatus comprising:
a single electrode arrangement comprising:
a single electrode (102) buried in the earth pit and configured to measure a resistance of the earth pit by one or more sensors at predefined time intervals; wherein the one or more sensors (106a-106b) are mounted on the single electrode; and an electronic module (104) communicatively coupled between the single electrode (102) and the communication system (116), and configured to:
receive the value of the resistance of the earth pit from the one or more sensors (106a-106b) via one or more communication means;
compare the value of the resistance with a threshold value;
communicate the value of the resistance of the earth pit to the communication system (116); and
generate an alert when the value of the resistance of the earth pit exceeds the threshold value, wherein the alert indicates occurrence of an earth fault or a discharge within the earth pit;

and wherein the single electrode (102) is connected via the one or more communication means to the electronic module (104).

10. The earthing system of claim 9, wherein the electronic module of the apparatus is further configured to:
communicate to the communication system a normal health condition of the earthing system during time intervals when the value of the resistance of the earth pit as measured by the one or more sensors (106a-106b) is below the threshold value; and
communicate to the communication system a deteriorated health condition of the earthing system along with the alert, when the value of the resistance of the earth pit as measured by the one or more sensors exceeds the threshold value.

11. The apparatus of claim 9, wherein the electronic module is further configured to:
receive a failure alert from the communication system, when a failure occurs within the communication system;
trigger the one or more sensors to measure the value of the resistance of the earth pit upon receiving the failure alert; and
communicate the resistance of the earth pit to the communication system, wherein the value of the resistance of the earth pit at a time of occurrence of the failure is a fault resistance associated with the earth fault or the discharge within the earth pit.

12. The apparatus of claim 9, wherein the electronic module is further configured to:
communicate an identifier of the earth pit along with the value of the resistance of the earth pit to the communication system; wherein the identifier comprises information related to a location of the earth pit; and
receive an alert from the communication system (116) when a soil resistivity value equivalent of the value of the resistance exceeds another threshold value, wherein the value of the resistance is converted to the soil resistivity value within the communication system.

13. A method (400) for generating an alert based on a health of an earthing system, the method comprising:

measuring (402), by a single electrode buried in an earth pit, a resistance of an earth pit associated with the earthing system, at predefined time intervals;
recording (404), by an electronic module, a value of the resistance, wherein the electronic module is communicatively coupled to the single electrode; wherein the resistance is indicative of one of a normal working condition and a faulty condition of the earth pit;
generating (406) the alert, by the electronic module, when the value of the resistance of the earth pit exceeds a threshold value; and
communicating (408), by the electronic module, the value of the resistance of the earth pit and the alert to a communication system.

14. The method of claim 13, wherein the value of the resistance of the earth pit is below the threshold value during the normal working condition, and wherein the faulty condition of the earth pit occurs when the value of the resistance of the earth pit exceeds the threshold value.

15. The method of claim 13, further comprising: receiving, by the electronic module, a failure alert from the communication system when a failure occurs within the communication system; triggering, by the electronic module, the single electrode to record the resistance of the earth pit upon receiving the failure alert from the communication system; and communicating, by the electronic module, the value of the resistance of the earth pit to the communication system, wherein the value of the resistance is a fault resistance of the earth pit that caused the failure.

16. The method of claim 13, wherein the earthing system comprises one or more of a plurality of earth pits connected within an earth grid, and a plurality of assorted earth pits located outside the earth grid, and wherein the earth pit is located within the earth grid or outside the earth grid.

17. The method of claim 16, wherein the earthing system provides a discharge path for electrical circuitry associated with the communication system through the one or more plurality of earth pits and the plurality of assorted earth pits.

18. The method of claim 13, further comprising: communicating, by the electronic module, an identifier of the earth pit along with the resistance of the earth pit to the communication system, wherein the resistance of the earth pit is converted by the communication system to a soil resistivity value; and receiving, by the electronic module, another alert from the communication system, when the soil resistivity value exceeds another threshold value, wherein the value of the resistance of the earth pit, the soil resistivity value of the earth pit, the threshold value of the resistance, the other threshold value of the soil resistivity value, and the identifier are stored in a database of the communication system.

19. The method of claim 13, further comprising: transmitting, by the electronic module, the alert to a mobile device associated with one or more of a regulatory body, a disaster management cell, a fire department via one or more communication networks, wherein the alert comprises information associated with occurrence of an earth fault or a discharge at the earth pit and a location of the earth pit.

* * * * *